US012769412B2

(12) United States Patent
Chiu et al.

(10) Patent No.: US 12,769,412 B2
(45) Date of Patent: Oct. 20, 2026

(54) ELECTRONIC DEVICE AND FORMING METHOD THEREOF

(71) Applicants: InnoLux Corporation, Miao-Li County (TW); CARUX TECHNOLOGY PTE. LTD., Singapore (SG)

(72) Inventors: Kuei-Chen Chiu, Miao-Li County (TW); Yu-Ti Huang, Tainan (TW); Cheng-Tso Chen, Tainan (TW); Li-Wei Sung, Tainan (TW)

(73) Assignees: Innolux Corporation, Miaoli County (TW); CARUX TECHNOLOGY PTE. LTD., Singapore (SG)

( * ) Notice: Subject to any disclaimer, the term of this patent is extended or adjusted under 35 U.S.C. 154(b) by 548 days.

(21) Appl. No.: 18/354,118

(22) Filed: Jul. 18, 2023

(65) Prior Publication Data

US 2024/0069660 A1 Feb. 29, 2024

(30) Foreign Application Priority Data

Aug. 26, 2022 (CN) ......................... 202211030988.7

(51) Int. Cl.

*G06F 3/041* (2006.01)
*G02F 1/1333* (2006.01)
*H10D 86/40* (2025.01)

(52) U.S. Cl.

CPC ........ *G06F 3/0412* (2013.01); *G02F 1/13338* (2013.01); *H10D 86/441* (2025.01); *G06F 2203/04103* (2013.01)

(58) Field of Classification Search

CPC ......... G06F 3/0412; G06F 2203/04103; G02F 1/13338; H10D 86/441
See application file for complete search history.

(56) References Cited

U.S. PATENT DOCUMENTS

2018/0095318 A1 4/2018 Pyo et al.
2018/0373079 A1* 12/2018 Yeh ....................... G06F 3/0412

FOREIGN PATENT DOCUMENTS

CN 109581711 A 4/2019

* cited by examiner

*Primary Examiner* — Peter M Albrecht
(74) *Attorney, Agent, or Firm* — JCIPRNET

(57) ABSTRACT

An electronic device and a forming method thereof are provided. The electronic device includes a substrate, a metal layer, a first insulating layer, a first conductive layer, a second insulating layer, and a second conductive layer. The metal layer is disposed on the substrate and includes a sensing line and a drain electrode. The first insulating layer is disposed on the metal layer. The first conductive layer is disposed on the first insulating layer and includes a touch electrode. The second insulating layer is disposed on the first conductive layer. The second conductive layer is disposed on the second insulating layer and includes a conductive pattern. The conductive pattern is electrically connected to the sensing line and the touch electrode.

12 Claims, 9 Drawing Sheets

ELECTRONIC DEVICE AND FORMING METHOD THEREOF

CROSS REFERENCE TO RELATED APPLICATIONS

This application claims priority of China Patent Application No. CN 202211030988.7, filed on Aug. 26, 2022, the entirety of which is incorporated by reference herein.

TECHNICAL FIELD

Some embodiments of the present disclosure relate to an electronic device and a forming method thereof, and, in particular, to an electronic device capable of reducing the number of masks in a manufacturing process and a forming method thereof.

BACKGROUND

In order to meet the requirements of users and respond to the development of manufacturing technology, for electronic devices, it is an obvious trend to reduce the number of masks and/or steps in the process of manufacturing electronic devices.

In the current manufacturing process, which is limited by the structural design of electronic devices, it is difficult to reduce the number of masks and/or steps in the manufacturing process, resulting in many problems such as high costs, long lead times, and high process complexity.

Although existing electronic devices and their forming methods have gradually met their intended uses, they still do not fully meet the requirements in all aspects. Therefore, there are still some problems to be overcome with respect to the electronic device and the forming method thereof.

SUMMARY

In some embodiments, an electronic device is provided. The electronic device includes a substrate, a metal layer, a first insulating layer, a first conductive layer, a second insulating layer, and a second conductive layer. The metal layer is disposed on the substrate and includes a sensing line and a drain electrode. The first insulating layer is disposed on the metal layer. The first conductive layer is disposed on the first insulating layer and includes a touch electrode. The second insulating layer is disposed on the first conductive layer. The second conductive layer is disposed on the second insulating layer and includes a conductive pattern. The conductive pattern is electrically connected to the sensing line and the touch electrode.

In some embodiments, an electronic device is provided. The electronic device includes a substrate, a metal layer, a first insulating layer, a first conductive layer, a second insulating layer, and a second conductive layer. The metal layer is disposed on the substrate and includes a sensing line. The first insulating layer is disposed on the metal layer. The first conductive layer is disposed on the first insulating layer and includes a touch electrode. The second insulating layer is disposed on the first conductive layer and includes a first opening. The second conductive layer is disposed on the second insulating layer. The first opening exposes at least a portion of the sensing line and at least a portion of the touch electrode.

In some embodiments, a method for forming an electronic device is provided. The method includes forming a sensing line on a substrate. A first insulating layer is formed on the sensing line. A touch electrode is formed on the first insulating layer. A second insulating layer is formed on the touch electrode. A portion of the second insulating layer and a portion of the first insulating layer are removed to expose the sensing line and the touch electrode. A conductive pattern is formed on the second insulating layer, so that the conductive pattern is electrically connected to the sensing line and the touch electrode.

The electronic device of the present disclosure may be applied in various types of electronic apparatus. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

The present disclosure can be more fully understood from the following detailed description when read in conjunction with the accompanying drawings. It should be noted that, according to the standard practice in the industry, the various features are not drawn to scale. In fact, the dimensions of the various features may be arbitrarily increased or reduced for clarity.

DETAILED DESCRIPTION

Figure 1:
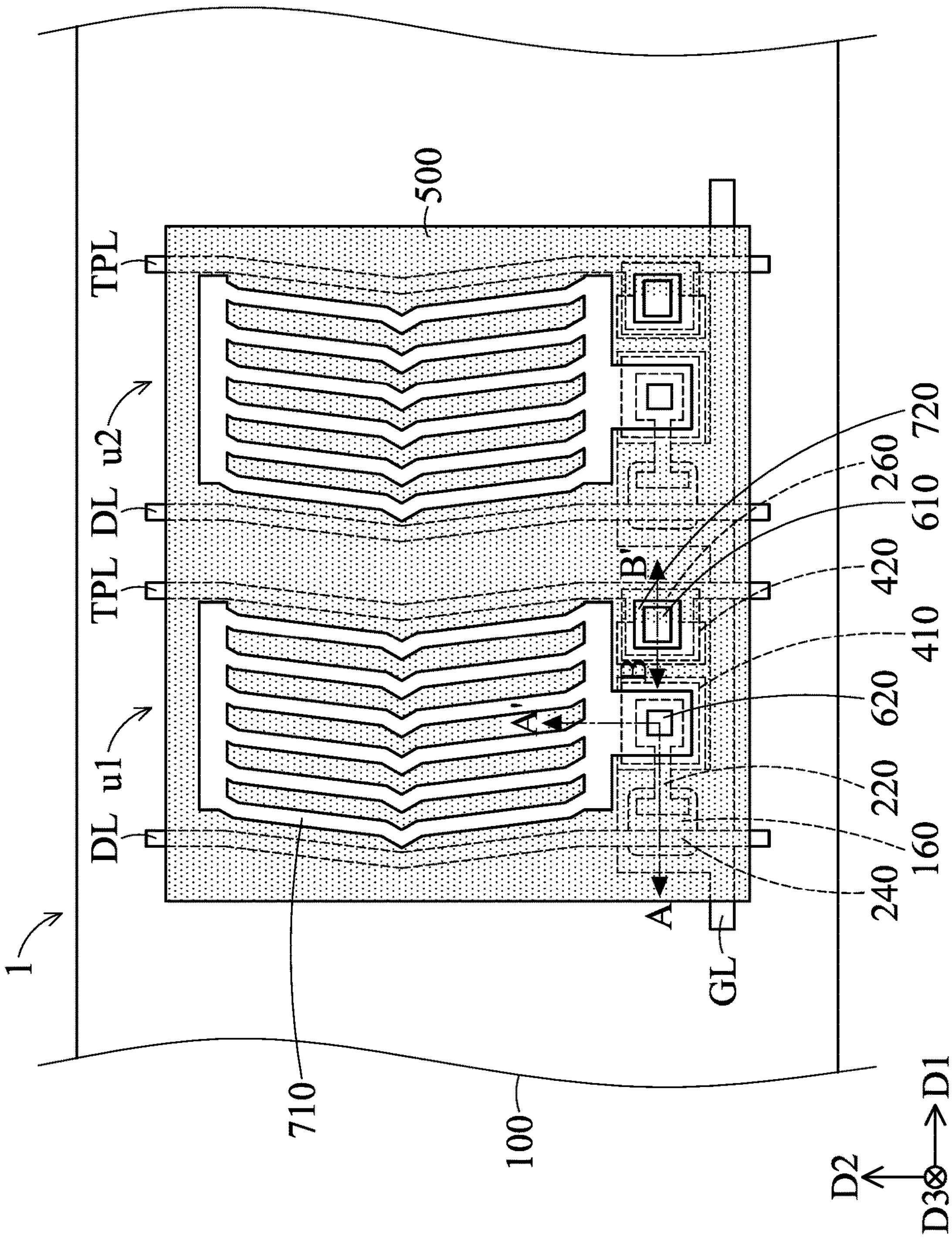
FIG. 1 is a schematic top view showing a layout of an electronic device according to some embodiments of the present disclosure.

Electronic devices of various embodiments of the present disclosure will be described in detail below. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar and/or corresponding reference numerals may be used in different embodiments to designate similar and/or corresponding elements in order to clearly describe the present disclosure. However, the use of these similar and/or corresponding reference numerals is only for the purpose of simply and clearly description of some embodiments of the present disclosure, and does not imply any correlation between the different embodiments and/or structures discussed.

It should be understood that relative terms, such as "lower", "bottom", "higher" or "top" may be used in various embodiments to describe the relative relationship of one element of the drawings to another element. It will be understood that if the device in the drawings were turned upside down, elements described on the "lower" side would become elements on the "upper" side. The embodiments of the present disclosure can be understood together with the drawings, and the drawings of the present disclosure are also regarded as a portion of the disclosure.

Furthermore, when it is mentioned that a first material layer is located on or over a second material layer, it may include the embodiment which the first material layer and the second material layer are in direct contact and the embodiment which the first material layer and the second material layer are not in direct contact with each other, that is one or more layers of other materials is between the first material layer and the second material layer. However, if the first material layer is directly on the second material layer, it means that the first material layer and the second material layer are in direct contact.

In addition, it should be understood that ordinal numbers such as "first", "second" and the like used in the description and claims are used to modify elements and are not intended to imply and represent the element(s) have any previous ordinal numbers, and do not represent the order of a certain element and another element, or the order of the manufacturing method, and the use of these ordinal numbers is only used to clearly distinguished an element with a certain name and another element with the same name. The claims and the specification may not use the same terms, for example, a first element in the specification may be a second element in the claim.

In some embodiments of the present disclosure, terms related to bonding and connection, such as "connecting", "interconnecting", "bonding", and the like, unless otherwise defined, may refer to two structures in direct contact, or may also refer to two structures not in direct contact, that is there is another structure disposed between the two structures. Moreover, the terms related to bonding and connection can also include embodiments in which both structures are movable, or in which both structures are fixed. Furthermore, the terms "electrically connected" or "electrically coupled" include any direct and indirect means of electrical connection.

Herein, the terms "about", "approximately", and "substantially" generally mean within 10%, within 5%, within 3%, within 2%, within 1%, or within 0.5% of a given value or range. The given value is an approximate value, that is, "about", "approximately", and "substantially" can still be implied without the specific description of "about", "approximately", and "substantially". The phrase "a range between a first value and a second value" means that the range includes the first value, the second value, and other values in between. Furthermore, any two values or directions used for comparison may have certain tolerance. If the first value is equal to the second value, it implies that there may be a tolerance within about 10%, within 5%, within 3%, within 2%, within 1%, or within 1% between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

Certain terms may be used throughout the specification and claims in this disclosure to refer to specific elements. A person of ordinary skills in the art should be understood that electronic device manufacturers may refer to the same element by different terms. The present disclosure does not intend to distinguish between elements that have the same function but with different terms. In the following description and claims, terms such as "including", "comprising", and "having" are open-ended words, so they should be interpreted as meaning "including but not limited to . . . ". Therefore, when the terms "including", "comprising", and/or "having" is used in the description of the present disclosure, it designates the presence of corresponding features, regions, steps, operations, and/or elements, but does not exclude the presence of one or more corresponding features, regions, steps, operations, and/or elements.

It should be understood that, in the following embodiments, features in several different embodiments may be replaced, recombined, and bonded to complete other embodiments without departing from the spirit of the present disclosure. The features of the various embodiments can be used in any combination as long as they do not violate the spirit of the disclosure or conflict with each other.

Unless otherwise defined, all terms (including technical and scientific terms) used herein have the same meaning as commonly understood by a person of ordinary skills in the art. It is understood that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

Herein, the respective directions are not limited to three axes of the rectangular coordinate system, such as the X-axis, the Y-axis, and the Z-axis, and may be interpreted in a broader sense. For example, the X-axis, the Y-axis, and the Z-axis may be perpendicular to each other, or may represent different directions that are not perpendicular to each other, but the present disclosure is not limited thereto. For convenience of description, hereinafter, the X-axis direction is the first direction D1 (width direction), the Y-axis direction is the second direction D2 (length direction), and the Z-axis direction is the third direction D3 (thickness direction). In some embodiments, the schematic top views described herein are schematic views of the XY plane and the schematic cross-sectional views described herein are schematic views of the XZ plane.

In some embodiments, the electronic device of the present disclosure may include a display device, a lighting device, an antenna device, a sensing device, or a titling device, but the present disclosure is not limited thereto. The electronic device may be a foldable or flexible electronic device. The display device may be a non-self-luminous display device or a self-luminous display device. The antenna device may be a liquid crystal antenna device or a non-liquid crystal antenna device. The sensing device may be a sensing device for sensing capacitance, light, heat, or ultrasonic waves, but the present disclosure is not limited thereto. In the present disclosure, the electronic device may include an electronic unit. The electronic unit may include passive elements and active elements, such as capacitors, resistors, inductors, diodes, transistors, and the like. The diodes may include light-emitting diodes or photodiodes. The light-emitting diodes may include, for example, organic light-emitting diodes (OLEDs), mini light-emitting diodes (mini LEDs), micro light-emitting diodes (micro LEDs), or quantum dot light-emitting diodes (quantum dot LED), but the present disclosure is not limited thereto. The titling device may be, for example, a display titling device or an antenna titling device, but the present disclosure is not limited thereto. It should be noted that, the electronic device can be any arrangement and combination of the foregoing, but the present disclosure is not limited thereto. Hereinafter, a touch device is used as an electronic device to illustrate the content of the present disclosure, but the present disclosure is not limited thereto. In some embodiments, the electronic device of the present disclosure may be applied to a touch in display (TID) device, but the present disclosure is not limited thereto.

In addition, the shape of the electronic device may be rectangular, circular, polygonal, a shape with curved edges, or another suitable shape. The electronic device may have a peripheral system, such as a processing system, a driving system, a control system, a light source system, a shelf system, or the like to support the display device or titling device. It should be noted that, the electronic device can be any arrangement and combination of the foregoing, but the present disclosure is not limited thereto.

It should be appreciated that, in some embodiments, additional processing steps may be provided before, during, and/or after a manufacturing method of an electronic device. In some embodiments, some of the described processing steps may be replaced or omitted, and the order of some of the described processing steps may be interchangeable. Furthermore, it should be understood that some of the described processing steps may be replaced or deleted for other embodiments of the method.

Referring to FIG. 1, it shows a schematic top view of a layout of an electronic device 1 according to some embodiments of the present disclosure. It should be understood that, in FIG. 1, some components of the electronic device 1 are omitted and some components are schematically shown for clarity. In some embodiments, additional components may be added to the electronic device 1 described below, or some components of the electronic device 1 shown in FIG. 1 may be replaced or omitted.

As shown in FIG. 1, in some embodiments, the electronic device 1 may include a substrate 100, various components disposed on the substrate 100, and various layers covering the substrate 100. As shown in FIG. 1, in some embodiments, the electronic device 1 may include a gate line (scanning line) GL disposed on the substrate 100, and a data line DL intersecting the gate line GL, and a touch electrode line TPL. In some embodiments, a plurality of gate lines GL, a plurality of data lines DL, and/or a plurality of touch electrode lines TPL may be provided on the substrate 100. For ease of illustration, FIG. 1 shows one gate line GL, two data lines DL, and two touch electrode lines TPL, but the present disclosure is not limited thereto. In some embodiments, the gate line GL may extend along the first direction D1, at least a portion of the data line DL may extend along the second direction D2, and the first direction D1 is different from the second direction D2. For example, in some embodiments, the first direction D1 is perpendicular to the second direction D2, but the present disclosure is not limited thereto.

In some embodiments, the extended shape of the data line DL may correspond to the extended shape of the pixel electrode 710. For example, in some embodiments, the data line DL may include a portion extending along the second direction D2 and another portion extending along a direction having an included angle with the second direction D2, but the present disclosure is not limited thereto. In some embodiments, the pixel electrode 710 may be linear, bending shape, or other suitable shapes, but the present disclosure is not limited thereto. In some embodiments, the gate line GL and a portion of the data line DL are substantially perpendicular or orthogonal.

In some embodiments, the gate lines GL and the data lines DL intersect each other, and the gate lines GL and the touch electrode lines TPL intersect each other, in order to define a plurality of pixel units. For ease of illustration, two pixel units u1 and u2 are shown in FIG. 1, but the present disclosure is not limited thereto, and the electronic device 1 may include any natural number of pixel units. In some embodiments, according to the lighting requirements of the electronic device 1, the arrangement and type of the pixel units u1 and u2 may be adjusted. For example, in some embodiments, the pixel units may be arranged in a matrix.

As shown in FIG. 1, the pixel unit u1 is used for illustration. In some embodiments, the pixel unit u1 may include a switching transistor. The data line DL may provide a data signal to the pixel unit u1 by a switching transistor, and the gate line GL may provide a scan pulse signal to the pixel unit u1 and cooperate with the switching transistor to jointly control the pixel unit u1. In some embodiments, the switching transistor may include a semiconductor layer 160, a source electrode 240, a drain electrode 220, and a gate electrode (not shown). In some embodiments, the gate electrode may be a portion of the gate line GL or be connected to the gate line GL. In some embodiments, the source electrode 240 may be a portion of the data line DL or be connected to the data line DL, but the present disclosure is not limited thereto. In other embodiments, depending on whether a voltage is applied, the source electrode 240 and the drain electrode 220 may be interchanged with each other. That is, the source electrode 240 may be used as a drain electrode, and the drain electrode 220 may be used as a source electrode. In some embodiments, the sensing line 260 may be a portion of the touch electrode line TPL or be connected to the touch electrode line TPL to transmit the touch electrode signal.

Figure 2B:
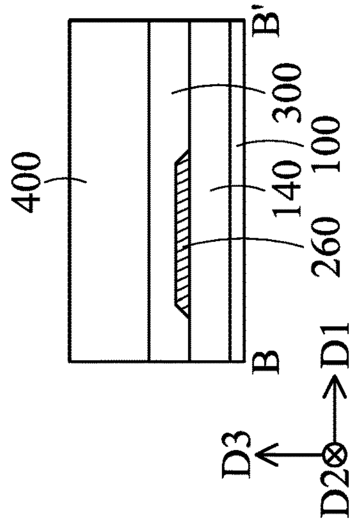
FIG. 2A, FIG. 2B, FIG. 3A, FIG. 3B, FIG. 4A, FIG. 4B, FIG. 5A, FIG. 5B, FIG. 6A, and FIG. 6B are schematic cross-sectional views showing an electronic device at different manufacturing stages according to some embodiments of the present disclosure, respectively.
Figure 2A:
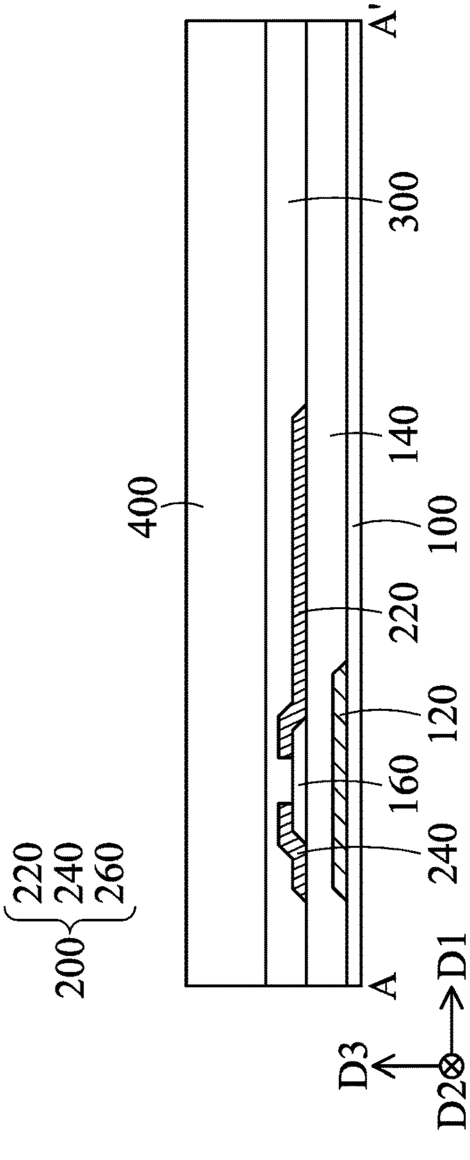

Referring to FIG. 2A and FIG. 2B, they show schematic cross-sectional views of the electronic device 1 at different manufacturing stages, respectively. FIG. 2A shows a schematic cross-sectional view taken along the section line A-A' shown in FIG. 1, and FIG. 2B shows a schematic cross-sectional view taken along the section line B-B' shown in FIG. 1.

As shown in FIG. 2A and FIG. 2B, a substrate 100 is provided. In some embodiments, the substrate 100 may include glass, quartz, sapphire, ceramics, polyimide (PI), polycarbonate (PC), polyethylene terephthalate (PET), polypropylene (PP), other suitable materials or a combination thereof, but the present disclosure is not limited thereto. In some embodiments, the substrate 100 may include a metal-glass fiber composite board or a metal-ceramic composite board, but the present disclosure is not limited thereto. In some embodiments, the substrate 100 may include a transparent substrate, a semi-transparent substrate, or an transparent substrate.

In some embodiments, the first metal layer 120 may be formed on the substrate 100. In some embodiments, the first metal layer 120 may be formed on the substrate 100, and the first metal layer 120 is patterned by a patterned mask (not shown) formed on the first metal layer 120. The patterned mask is then removed by a removal process such as an ashing process. In some embodiments, the first metal layer 120 may serve as the gate electrode of the aforementioned switching transistor.

In some embodiments, the material of the first metal layer 120 may include or may be a conductive material. In some embodiments, the conductive material may include or may be metal, metal nitride, semiconductor material, any other suitable conductive material or any combination thereof, but the present disclosure is not limited thereto. In some embodiments, the conductive material may include or may be gold (Au), nickel (Ni), platinum (Pt), palladium (Pd), iridium (Ir), titanium (Ti), chromium (Cr), tungsten (W), aluminum (Al), copper (Cu), molybdenum (Mo), titanium (Ti), silver (Ag), magnesium (Mg), alloys thereof or compounds thereof, other suitable conductive materials or any combination of the foregoing, but the present disclosure is not limited thereto. In some embodiments, the conductive material may include or be a transparent conductive oxide (TCO). For example, the transparent conductive oxide may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), other suitable transparent conductive material or any combination of the foregoing, but the present disclosure is not limited thereto. In some embodiments, for example, the first metal layer 120 may be formed by a chemical vapor deposition, a sputtering, a resistance heating evaporation, an electron beam evaporation, a physical vapor deposition (PVD), other suitable deposition processes, or any combination of the foregoing, but the present disclosure is not limited thereto.

Next, in some embodiments, a passivation layer 140 is formed on the first metal layer 120. In some embodiments, the passivation layer 140 may serve as a planarization layer and/or an insulating layer. In some embodiments, the material of the passivation layer 140 may include or may be an insulating material. In some embodiments, the material of the passivation layer 140 may include or may be an organic material, an inorganic material, or any combination of the foregoing, but the present disclosure is not limited thereto. In some embodiments, the organic material may include or may be an oxide such as silicon oxide, a nitride such as silicon nitride, an oxynitride such as silicon oxynitride, other suitable organic materials, or any combination of the foregoing, but the present disclosure is not limited thereto. In some embodiments, for example, the passivation layer 140 may be formed by a chemical vapor deposition (CVD), a sputtering, a resistance heating evaporation, an electron beam evaporation, other suitable deposition methods, or any combination of the foregoing.

In some embodiments, a patterned semiconductor layer 160 may be formed on the passivation layer 140 so as to control the switching transistor as a normally-on or normally-off transistor by the semiconductor layer 160. In some embodiments, the semiconductor layer 160 may include a semiconductor material, and may be formed by, for example, a chemical vapor deposition, a sputtering, a resistance heating evaporation, an electron beam evaporation, other suitable deposition methods, or any combination of the foregoing.

Following the above, in some embodiments, a second metal layer (metal layer) 200 may be formed on the passivation layer 140 and the semiconductor layer 160. In some embodiments, the material and forming method of the second metal layer 200 may be the same as or different from the material and forming method of the first metal layer 120. In some embodiments, the second metal layer 200 is conformally formed on the passivation layer 140 and the semiconductor layer 160, and then the second metal layer 200 is patterned. In some embodiments, the patterned second metal layer 200 may include the source electrode 240 (as shown in FIG. 2A) and the drain electrode 220 (as shown in FIG. 2A) of the switching transistor shown in FIG. 1 and the sensing line 260 (as shown in FIG. 2B).

Then, in some embodiments, the first insulating layer 300 and the intermediate insulating layer 400 (third insulating layer) may be sequentially formed on the second metal layer 200. In some embodiments, the first insulating layer 300 may be blanket formed on the second metal layer 200 and the semiconductor layer 160, and then the intermediate insulating layer 400 may be blanket formed on the first insulating layer 300. In some embodiments, the material and forming method of the first insulating layer 300 and/or the intermediate insulating layer 400 may be the same as or different from the material and forming method of the passivation layer 140. In some embodiments, the first insulating layer 300 may have a thickness from about 500 angstroms (Å) to about 3000 Å in the third direction D3. For example, the thickness of the first insulating layer 300 is about 500 Å, 750 Å, 1000 Å, 1250 Å, 1500 Å, 1750 Å, 2000 Å, 2250 Å, 2500 Å, 2750 Å, 3000 Å or any value or range of values between the aforementioned values, but the present disclosure is not limited thereto. In some embodiments, the second metal layer 200 may be protected by the first insulating layer 300, thereby reducing defects in the second metal layer 200 caused by the forming method for disposing the intermediate insulating layer 400 on the second metal layer 200.

In some embodiments, the intermediate insulating layer 400 may be an organic insulating layer. In some embodiments, in the third direction D3, the intermediate insulating layer 400 may have a thickness from about 1 μm to about 3 μm, so as to increase the distance between the pixel electrode 710 and the data line DL and the gate line GL, thereby reducing the problem of electrical coupling and providing a planarization function design. For example, the thickness of the intermediate insulating layer 400 is about 1 μm, 1.25 μm, 1.5 μm, 1.75 μm, 2 μm, 2.25 μm, 2.5 μm, 2.75 μm, 3 μm or any value or range of values between the aforementioned values, but the present disclosure is not limited thereto.

In other embodiments, the intermediate insulating layer 400 may be omitted. In other words, in the embodiment in which the intermediate insulating layer 400 is omitted, other components subsequently formed on the intermediate insulating layer 400 may be directly formed on the first insulating layer 300.

Figure 3B:
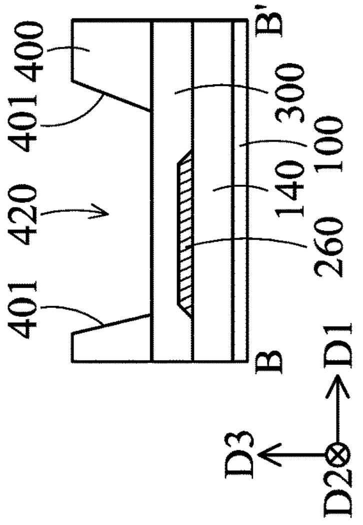
Figure 3A:
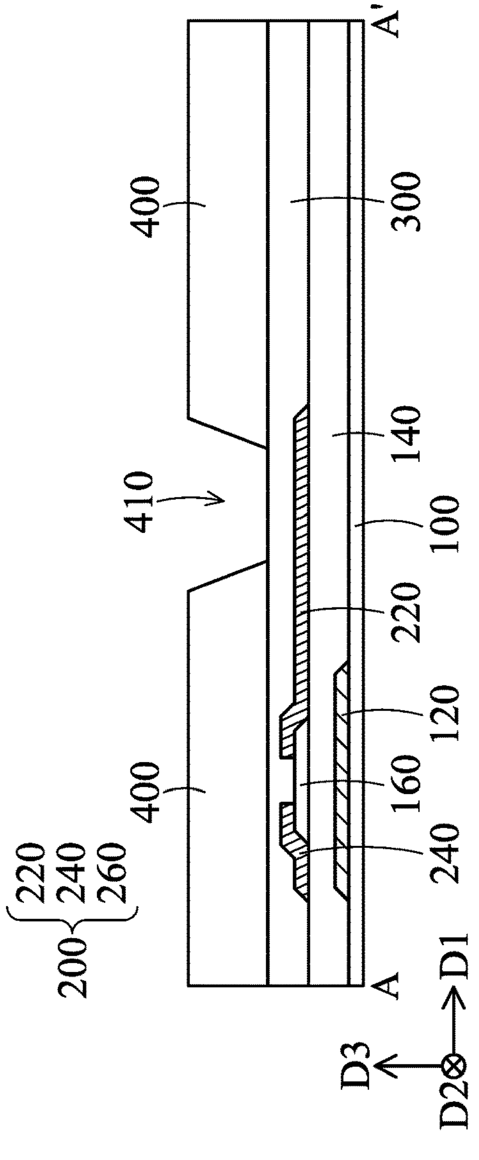

Referring to FIG. 3A and FIG. 3B, they show schematic cross-sectional views of the electronic device 1 at different manufacturing stages, respectively. FIG. 3A shows a schematic cross-sectional view taken along the section line A-A' shown in FIG. 1, and FIG. 3B shows a schematic cross-sectional view taken along the section line B-B' shown in FIG. 1.

As shown in FIG. 3A, in some embodiments, a first intermediate opening 410 is formed in the intermediate insulating layer 400 to expose the top surface of the first insulating layer 300. In some embodiments, the first intermediate opening 410 may be obtained by performing a photolithography and/or etching process or other suitable processes to remove a portion of the intermediate insulating layer 400. In some embodiments, the etching process may include dry etching, wet etching, or other etching methods (for example, reactive ion etching). The etching process may also be purely chemical etching (plasma etching), purely physical etching (ion milling), or a combination thereof. In some embodiments, the position of the first intermediate opening 410 may correspond to the drain electrode 220.

As shown in FIG. 3B, in some embodiments, a second intermediate opening 420 is formed in the intermediate insulating layer 400 to expose the top surface of the first insulating layer 300. In some embodiments, the position of the second intermediate opening 420 may correspond to the sensing line 260. In some embodiments, the intermediate insulating layer 400 may have a side surface 401.

Figure 4B:
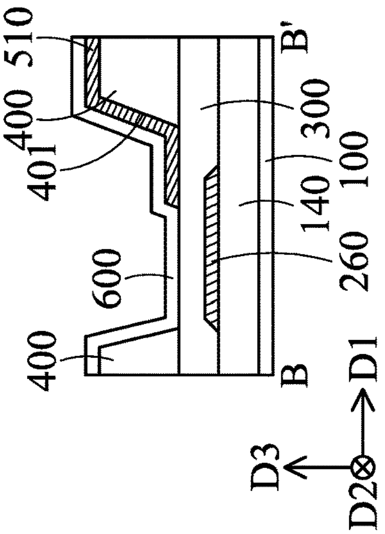
Figure 4A:
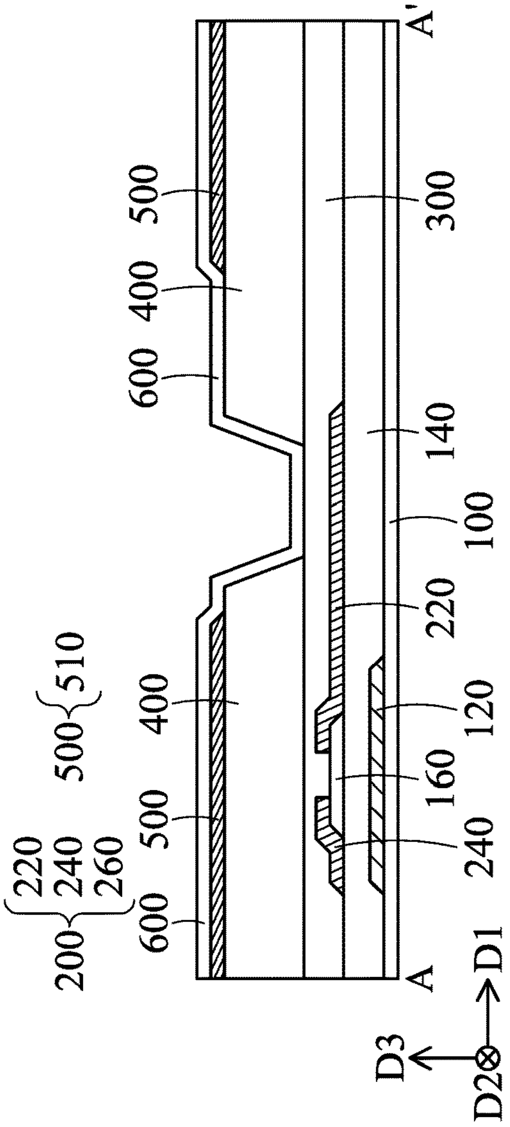

Referring to FIG. 4A and FIG. 4B, they show schematic cross-sectional views of the electronic device 1 at different manufacturing stages, respectively. FIG. 4A shows a schematic cross-sectional view taken along the section line A-A' shown in FIG. 1, and FIG. 4B shows a schematic cross-sectional view taken along the section line B-B' shown in FIG. 1.

As shown in FIG. 4A and FIG. 4B, in some embodiments, the first conductive layer 500 is formed on the intermediate insulating layer 400. That is, the intermediate insulating layer 400 is between the first insulating layer 300 and the first conductive layer 500. In some embodiments, the material and forming method of the first conductive layer 500 may be the same as or different from the material and forming method of the first metal layer 120 and/or the second metal layer 200. In some embodiments, the first conductive layer 500 is conformally formed on the intermediate insulating layer 400 and the first insulating layer 300, and then the first conductive layer 500 is patterned. In some embodiments, the first conductive layer 500 exposes the first intermediate opening 410. In some embodiments, as shown in FIG. 4B, the first conductive layer 500 may include touch electrodes 510. In some embodiments, the touch electrode 510 covers the side surface 401 of the intermediate insulating layer 400.

Following the above, in some embodiments, the second insulating layer 600 is formed on the first conductive layer 500. In some embodiments, the second insulating layer 600 is blanket formed on the first conductive layer 500, the intermediate insulating layer 400, and the first insulating layer 300. In some embodiments, the material and forming method of the second insulating layer 600 may be the same as or different from the material and forming method of the intermediate insulating layer 400, the first insulating layer 300, and/or the passivation layer 140. In some embodiments, the second insulating layer 600 may have a thickness from about 500 Å to about 3000 Å in the third direction D3. For example, the thickness of the second insulating layer 600 is about 500 Å, 750 Å, 1000 Å, 1250 Å, 1500 Å, 1750 Å, 2000 Å, 2250 Å, 2500 Å, 2750 Å, 3000 Å or any value or range of values between the aforementioned values, but the present disclosure is not limited thereto.

Figure 5B:
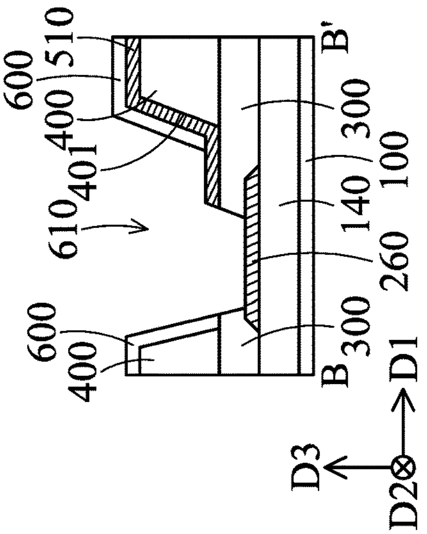
Figure 5A:
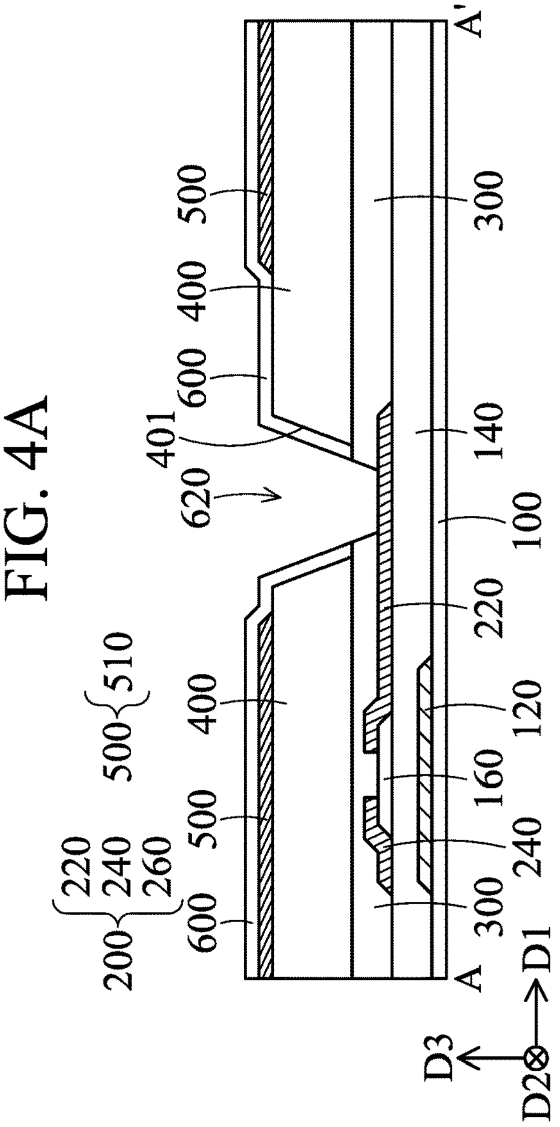

Referring to FIG. 5A and FIG. 5B, they show schematic cross-sectional views of the electronic device 1 at different manufacturing stages, respectively. FIG. 5A shows a schematic cross-sectional view taken along the section line A-A' shown in FIG. 1, and FIG. 5B shows a schematic cross-sectional view taken along the section line B-B' shown in FIG. 1. As shown in FIG. 5A and FIG. 5B, a first opening 610 and a second opening 620 are formed in the second insulating layer 600.

As shown in FIG. 5A, in some embodiments, a second opening 620 is formed in the second insulating layer 600. In some embodiments, the second opening 620 passes through the second insulating layer 600 and the first insulating layer 300 and exposes at least a portion of the drain electrode 220. Since the second opening 620 may expose a portion of the top surface of the drain electrode 220, subsequently formed components may be electrically connected to the drain electrode 220 through the second opening 620. In some embodiments, in the first direction D1, the width of the second opening 620 is smaller than the width of the first intermediate opening 410, so the second insulating layer 600 covers the side surface 401 of the intermediate insulating layer 400.

As shown in FIG. 5B, in some embodiments, a first opening 610 is formed in the second insulating layer 600. In some embodiments, the first opening 610 passes through the second insulating layer 600 and the first insulating layer 300 and exposes at least a portion of the sensing line 260 and at least a portion of the touch electrode 510. Since the first opening 610 may expose a portion of the top surface of the sensing line 260 and portions of the top surface and the side surface of the touch electrode 510, subsequently formed components may be electrically connected to the sensing line 260 and the touch electrode 510 through the first opening 610. In some embodiments, the first opening 610 does not expose the intermediate insulating layer 400. In some embodiments, along the first direction D1, the width of the first opening 610 is smaller than the width of the second intermediate opening 420, so the second insulating layer 600 covers the side surface 401 of the intermediate insulating layer 400. In some embodiments, the second opening 620 and the first opening 610 may be disposed in the same layer.

Figure 6B:
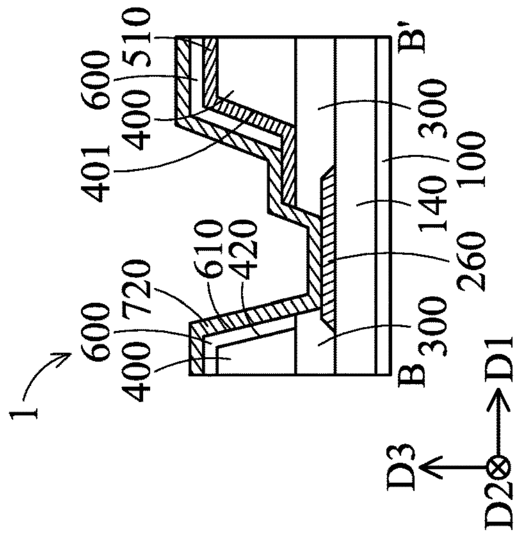
Figure 6A:
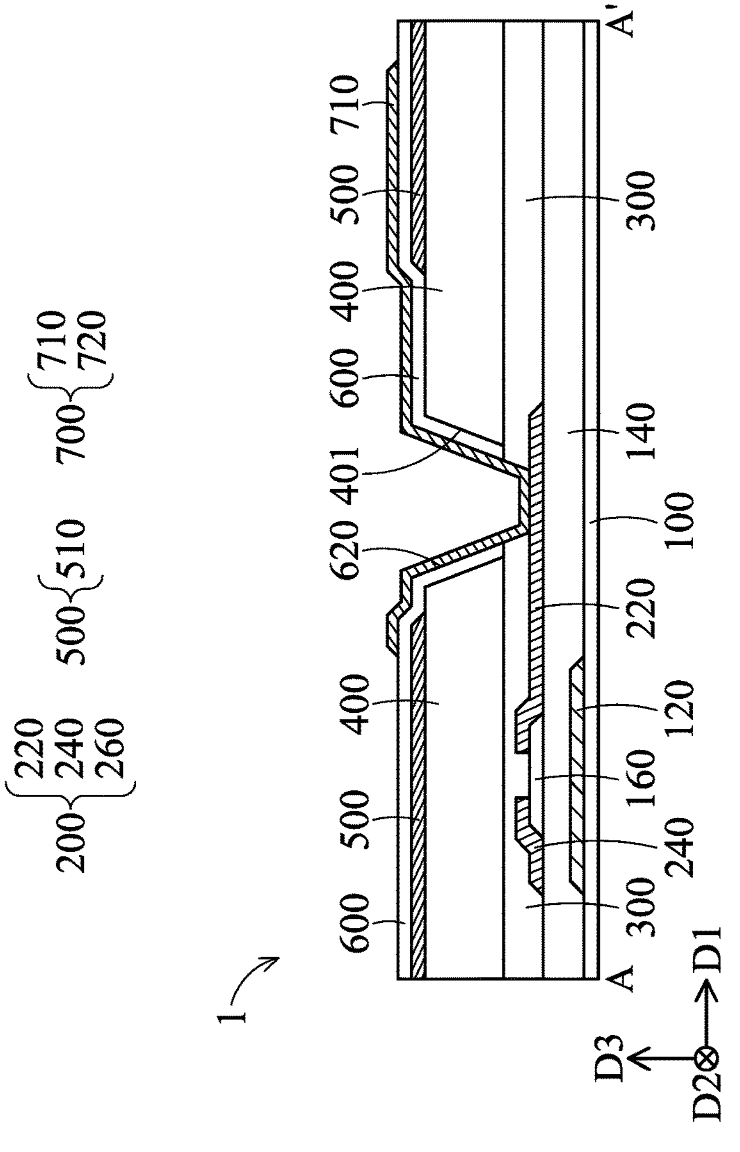
Figure 6C:
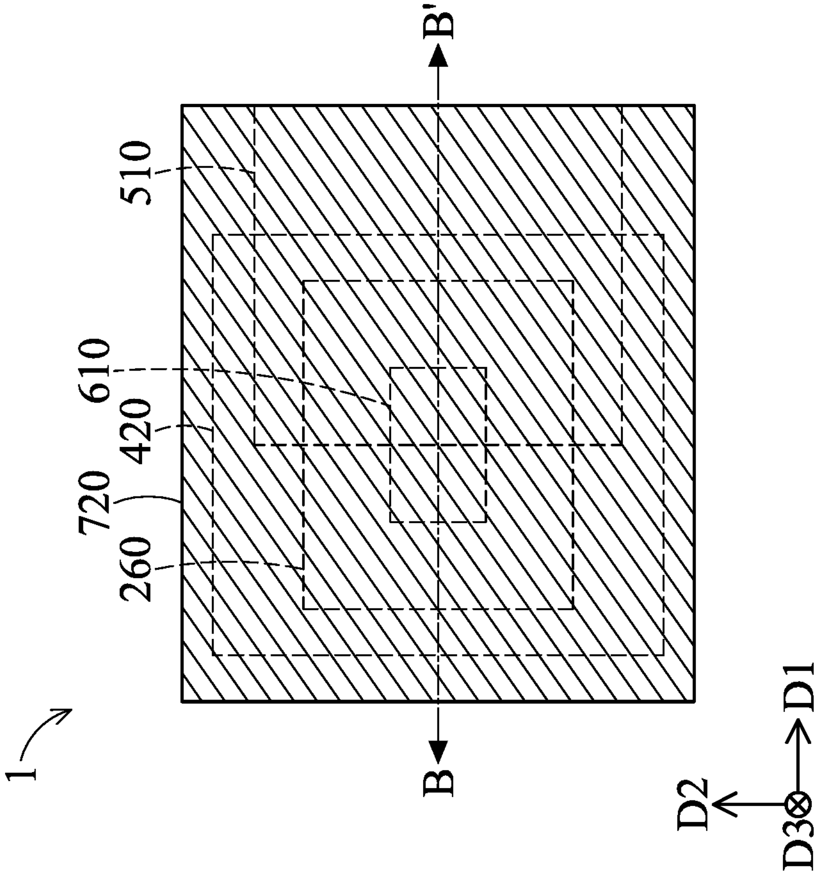
FIG. 6C is a schematic top view showing an electronic device according to some embodiments of the present disclosure.

Referring to FIG. 6A, FIG. 6B, and FIG. 6C, they show schematic cross-sectional views and a schematic top view of the electronic device 1 at different manufacturing stages, respectively. FIG. 6A shows a schematic cross-sectional view taken along the section line A-A' shown in FIG. 1, FIG. 6B shows a schematic cross-sectional view taken along the section line B-B' shown in FIG. 1, and FIG. 6C shows a schematic top view of FIG. 6B.

As shown in FIG. 6A and FIG. 6B, in some embodiments, the second conductive layer 700 is formed on the second insulating layer 600 to obtain the electronic device 1. In some embodiments, the second conductive layer 700 is conformally formed on the second insulating layer 600, and then the second conductive layer 700 is patterned. In some embodiments, the second conductive layer 700 may include a pixel electrode 710 and a conductive pattern 720. In some embodiments, the material and forming method of the second conductive layer 700 may be the same as or different from the material and forming method of the first conductive layer 500, the first metal layer 120, and/or the second metal layer 200.

As shown in FIG. 6A, in some embodiments, the pixel electrode 710 of the second conductive layer 700 may be conformally formed on the top surface and the side surface of the second insulating layer 600, on the side surface of the first insulating layer 300, and on the top surface of the drain electrode 220. In some embodiments, the pixel electrode 710 may be formed in the second opening 620 as shown in FIG. 5A. Therefore, a portion of the pixel electrode 710 may cover the second opening 620 so that the pixel electrode 710 is electrically connected to the drain electrode 220. In some embodiments, the pixel electrode 710 may be in direct contact with the drain electrode 220, so the pixel electrode 710 transmits signals through the second metal layer 200.

As shown in FIG. 6B, in some embodiments, the conductive pattern 720 of the second conductive layer 700 may be conformally formed on the top surface and the side surface of the second insulating layer 600, on the top surface and the side surface of the touch electrode 510, on the side surface of the first insulating layer 300, and on the top surface of the sensing line 260. In some embodiments, the conductive pattern 720 may be formed in the first opening 610 as shown in FIG. 5B. Therefore, a portion of the conductive pattern 720 covers a portion of the first opening 610 so that the conductive pattern 720 is electrically connected to the sensing line 260 and the touch electrode 510. In some embodiments, the second insulating layer 600 may cover the top surface and the side surface of the touch electrode 510. In some embodiments, the conductive pattern 720 is in direct contact with the sensing line 260 and the touch electrode 510, so the conductive pattern 720 transmits signals through the second metal layer 200.

As shown in FIG. 6C, for convenience of illustration, the conductive pattern 720, the first opening 610 corresponding to the second insulating layer 600, the touch electrode 510, the second intermediate opening 420 corresponding to the intermediate insulating layer 400, and the sensing line 260 are shown in the top view. In addition, as mentioned above, the side surfaces of the first opening 610 and the second intermediate opening 420 are inclined surfaces. However, for the convenience of illustration, the schematic top view shown in FIG. 6C shows that the side surfaces are substantially vertical surfaces, but the present disclosure is not limited thereto.

As shown in FIG. 6C, in some embodiments, the first opening 610 is within the second intermediate opening 420. In some embodiments, the projection of the intermediate insulating layer 400 on the substrate 100 is located within the projection of the second insulating layer 600 on the substrate 100. Therefore, when the second intermediate opening 420 has a large size, it is helpful to conformally form the conductive pattern 720, thereby increasing the reliability of the conductive pattern 720. In addition, when the second intermediate opening 420 has the large size, it helps to increase the margin of electrical connection between the conductive pattern 720, the touch electrode 510, and the sensing line 260.

In some embodiments, the size of the first opening 610 may be about 1 μm×1 μm to 20 μm×20 μm in a top view. For example, the size of the first opening 610 is about 1 $\mu m^2$, 50 $\mu m^2$, 100 $\mu m^2$, 150 $\mu m^2$, 200 $\mu m^2$, 250 $\mu m^2$, 300 $\mu m^2$, 350 $\mu m^2$, 400 $\mu m^2$ or any value or range of values between the aforementioned values, but the present disclosure is not limited thereto. In some embodiments, along the first direction D1 and/or the second direction D2, the width and/or length of the first opening 610 may be between about 1 μm and 20 μm, so that the conductive pattern 720 may be effectively electrically connected to the touch electrodes 510 and the sensing lines 260 and the pixel unit is prevented from sacrificing too much aperture ratio. For example, the width and/or length of the first opening 610 is about 1 μm, 2.5 μm, 5 μm, 7.5 μm, 10 μm, 12.5 μm, 15 μm, 17.5 μm, 20 μm or any value or range of values between the aforementioned values, but the present disclosure is not limited thereto.

FIG. 7A, FIG. 7B, FIG. 8A, and FIG. 8B show schematic cross-sectional views and schematic top views of electronic devices 2 and 3 according to some embodiments of the present disclosure.

Figure 7B:
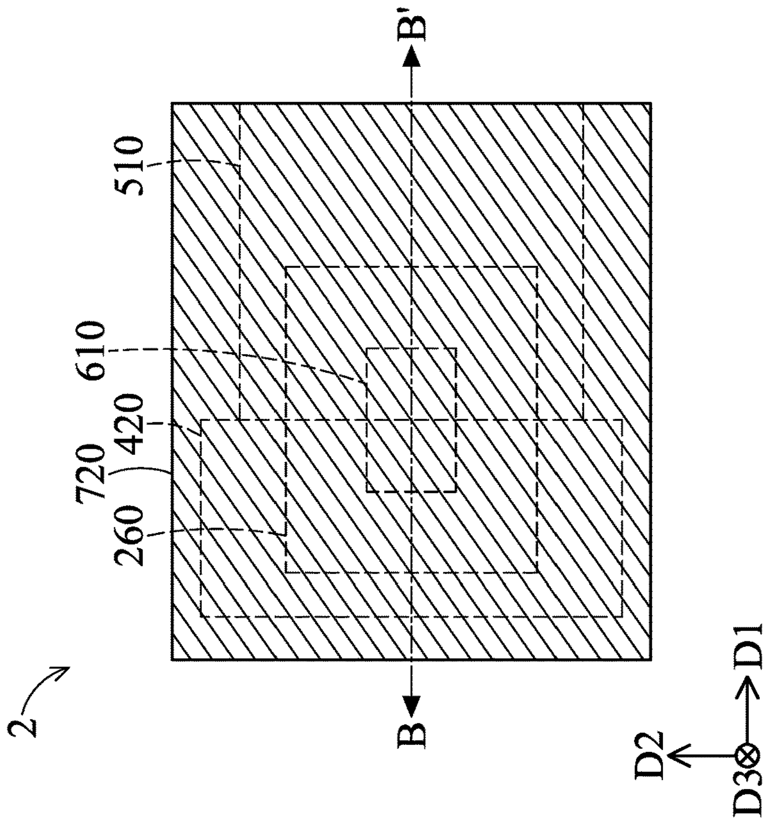
FIG. 7A and FIG. 7B are schematic cross-sectional views and schematic top views showing an electronic device according to some embodiments of the present disclosure, respectively.
Figure 7A:
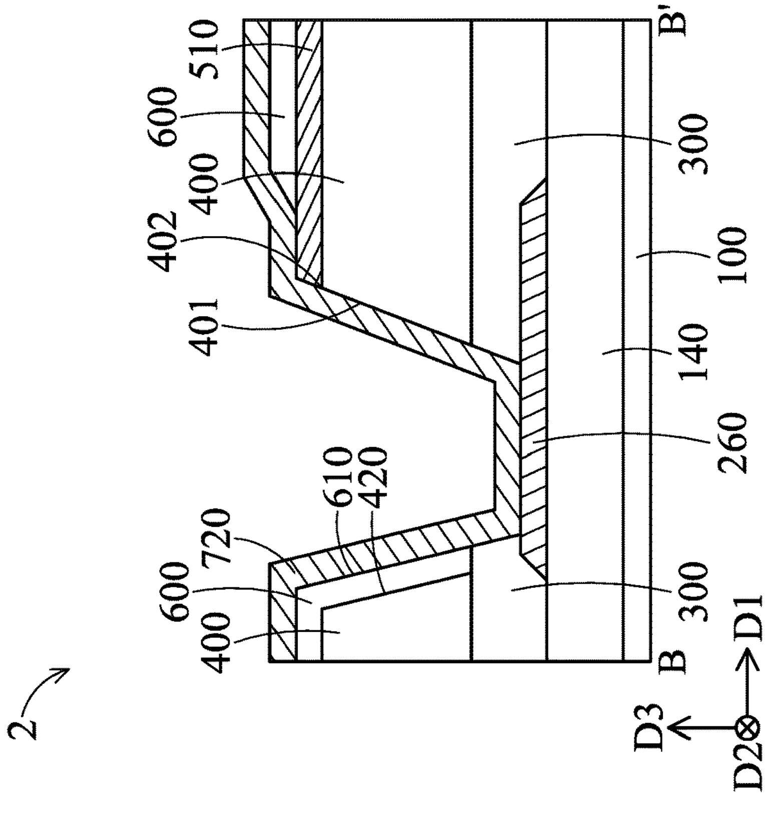

As shown in FIGS. 7A and 7B, in some embodiments, a portion of the first opening 610 is inside the second intermediate opening 420, and another portion of the first opening 610 is outside the second intermediate opening 420. In some embodiments, the projection of the intermediate insulating layer 400 on the substrate 100 partially overlaps with the projection of the second insulating layer 600 on the substrate 100 and partially does not overlap with the projection of the second insulating layer 600 on the substrate 100. In some embodiments, the first opening 610 exposes the side surface 401 of the intermediate insulating layer 400 and the top surface and side surface of the touch electrode 510.

In some embodiments, the touch electrode 510 exposes the side surface 401 of the intermediate insulating layer 400. In other words, the touch electrode 510 does not cover the side surface 401 of the intermediate insulating layer 400. In this embodiment, the touch electrode 510 is disposed on the top surface of the intermediate insulating layer 400 and exposes the side surface 401 of the intermediate insulating layer 400 so as to improve the reliability of the touch electrode 510, thereby improving the reliability of the electronic device 2. In addition, the touch electrode 510 may be effectively electrically connected to the sensing line 260 through the conductive pattern 720. In some embodiments, the second insulating layer 600 may expose the side surface of the touch electrode 510.

Figure 8B:
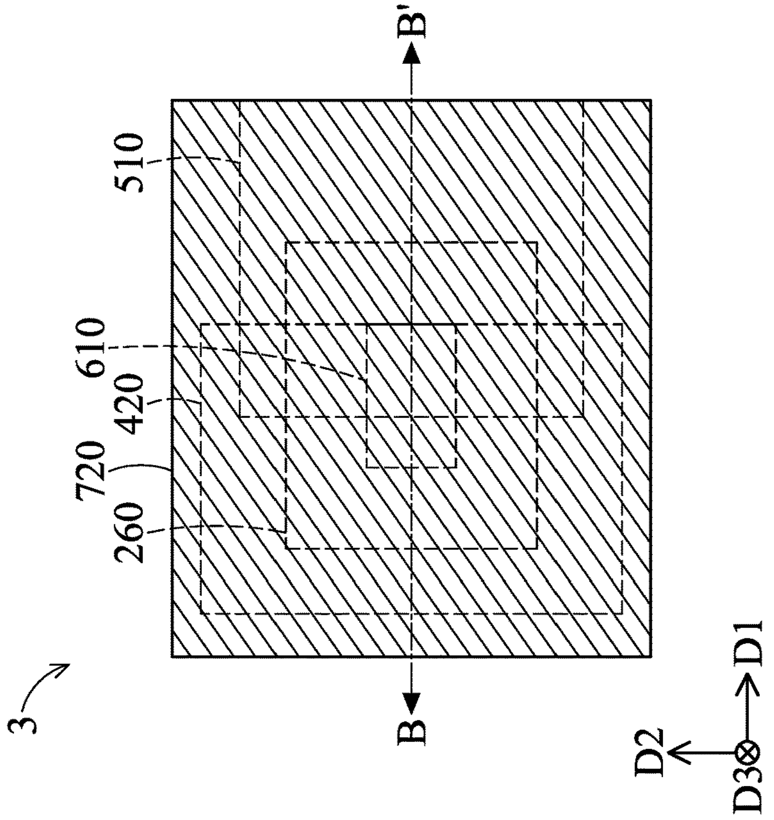
FIG. 8A and FIG. 8B are schematic cross-sectional views and schematic top views showing an electronic device according to some embodiments of the present disclosure, respectively.
Figure 8A:
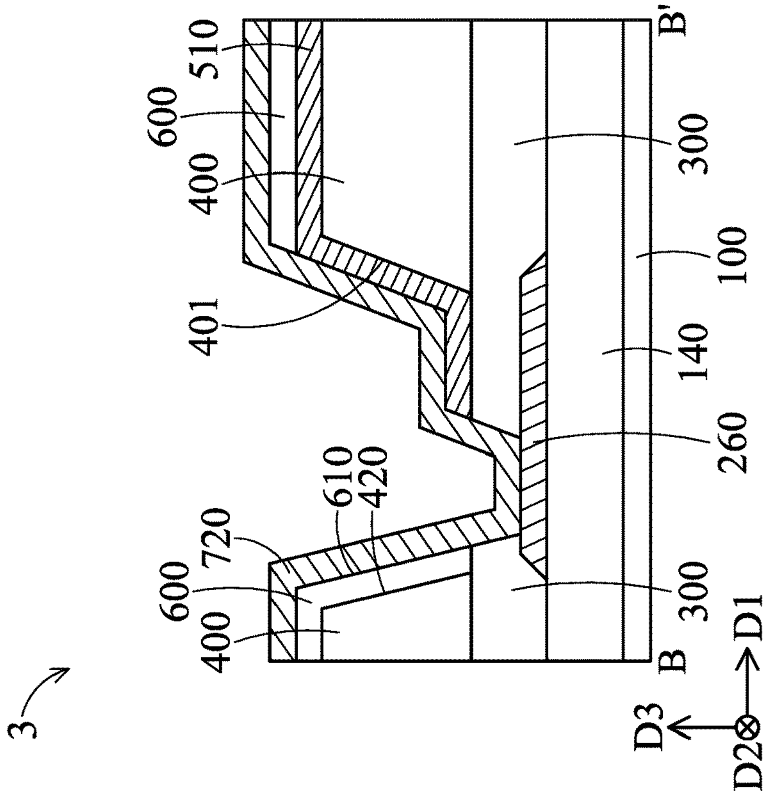

As shown in FIGS. 8A and 8B, in some embodiments, the first opening 610 is within the second intermediate opening 420. In some embodiments, the second insulating layer 600 may cover the top surface of the touch electrode 510 and expose the side surface of the touch electrode 510. In some embodiments, when the width of the touch electrode 510 in the first direction D1 is increased, the impedance of the touch electrode 510 will be decreased, thereby improving the electrical properties of the electronic device 3.

Figure 9:
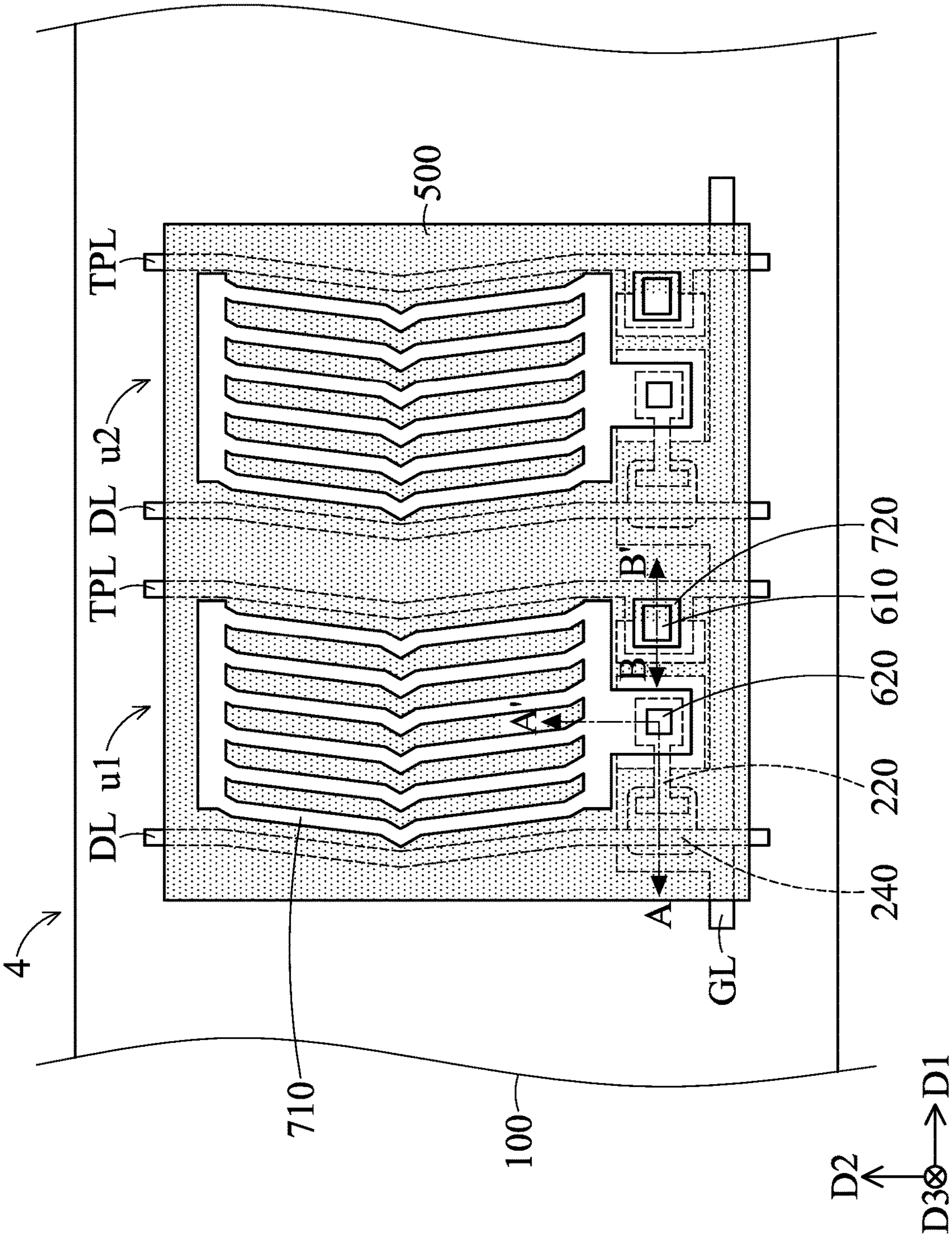
FIG. 9 is a schematic top view showing a layout of an electronic device according to some embodiments of the present disclosure.

FIG. 9 shows a schematic top view of the layout of the electronic device 4 according to some embodiments of the present disclosure. Portions in FIG. 9 that are the same as or similar to those in FIG. 1 will not be repeated. As shown in FIG. 9, the intermediate insulating layer 400 is omitted.

Figure 10B:
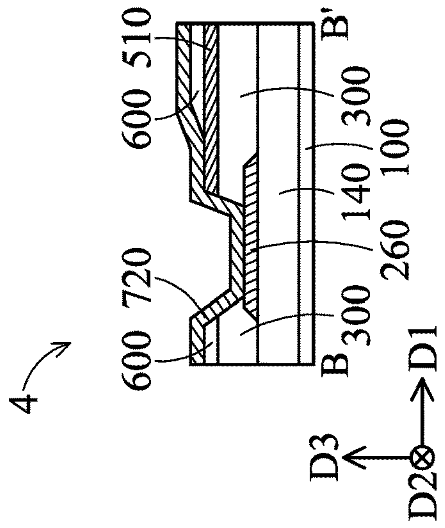
FIG. 10A and FIG. 10B are schematic cross-sectional views of electronic devices according to some embodiments of the present disclosure, respectively.
Figure 10A:
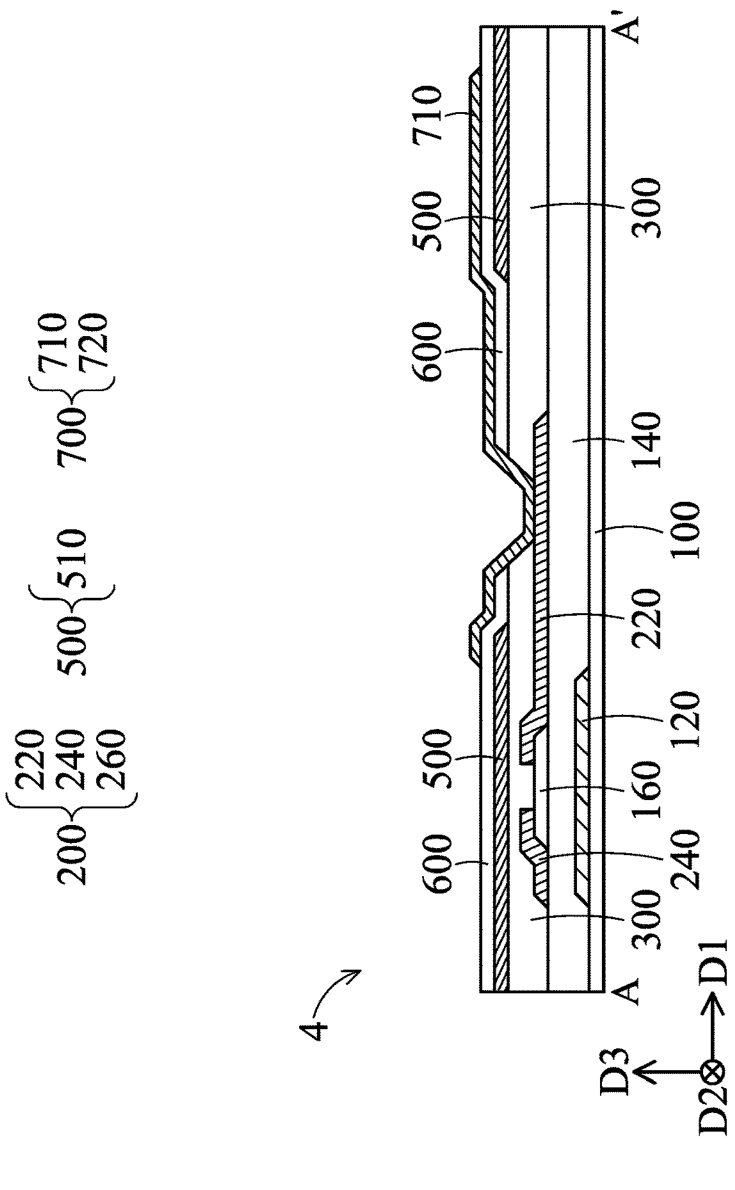

FIG. 10A and FIG. 10B show schematic cross-sectional views of the electronic device 4 according to some embodiments of the present disclosure, respectively. As shown in FIG. 10A and FIG. 10B, the intermediate insulating layer 400 is omitted, so at least a portion of the first insulating layer 300 may be in direct contact with at least a portion of the second insulating layer 600.

In summary, according to the embodiments of the present disclosure, the pixel signal and the touch signal are in the same layer, that is, in the second metal layer, thereby reducing the number of masks and/or the number of steps in the manufacturing process to reduce costs and/or shorten lead times. In detail, the drain electrode in the second metal layer is in direct contact with the pixel electrode to be electrically connected with the pixel electrode. In other words, the drain electrode of the second metal layer and the pixel electrode may be regarded as a pixel electrode as a whole. Thus, the pixel signal may be transmitted to another layer by the second metal layer. The sensing line in the second metal layer is electrically connected to the touch electrode by the conductive pattern. In other words, the sensing line and the touch electrode may be regarded as a common electrode as a whole. Therefore, when the pixel signal and the touch signal are in the same layer, the number of masks and/or the number of steps in the manufacturing process may be reduced by using the common electrode structure.

The features among the various embodiments may be arbitrarily combined as long as they do not violate or conflict with the spirit of the disclosure. In addition, the scope of the present disclosure is not limited to the process, machine, manufacturing, material composition, device, method, and step in the specific embodiments described in the specification. A person of ordinary skill in the art will understand current and future processes, machine, manufacturing, material composition, device, method, and step from the content disclosed in some embodiments of the present disclosure, as long as the current or future processes, machine, manufacturing, material composition, device, method, and step performs substantially the same functions or obtain substantially the same results as the present disclosure. Therefore, the scope of the present disclosure includes the above-mentioned process, machine, manufacturing, material composition, device, method, and steps. It is not necessary for any embodiment or claim of the present disclosure to achieve all of the objects, advantages, and/or features disclosed herein.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
- a substrate;
- a metal layer disposed on the substrate and comprising a sensing line and a drain electrode;
- a first insulating layer disposed on the metal layer;
- a first conductive layer disposed on the first insulating layer and comprising a touch electrode;
- a second insulating layer disposed on the first conductive layer;
- a second conductive layer disposed on the second insulating layer and comprising a conductive pattern; and
- a third insulating layer disposed between the first insulating layer and the first conductive layer,
- wherein the conductive pattern is electrically connected to the sensing line and the touch electrode,
- wherein a projection of the third insulating layer on the substrate is located within a projection of the second insulating layer on the substrate.

2. The electronic device as claimed in claim 1, wherein the second insulating layer further comprises a first opening, and the first opening exposes at least a portion of the sensing line and at least a portion of the touch electrode.

3. The electronic device as claimed in claim 2, wherein at least a portion of the conductive pattern covers the first opening.

4. The electronic device as claimed in claim 1, wherein the second insulating layer further comprises a second opening, and the second opening exposes at least a portion of the drain electrode.

5. The electronic device as claimed in claim 4, wherein the second conductive layer further comprises a pixel electrode, and at least a portion of the pixel electrode covers the second opening and is electrically connected to the drain electrode.

6. The electronic device as claimed in claim 1, wherein the touch electrode covers a side surface of the third insulating layer.

7. The electronic device as claimed in claim 1, wherein the second insulating layer further comprises a second opening, and the second opening does not expose the third insulating layer.

8. The electronic device as claimed in claim 1, wherein at least a portion of the first insulating layer and at least a portion of the second insulating layer are in direct contact.

9. The electronic device as claimed in claim 1, wherein the second insulating layer covers a side surface of the touch electrode.

10. An electronic device, comprising:
- a substrate;
- a metal layer disposed on the substrate and comprising a sensing line;
- a first insulating layer disposed on the metal layer;
- a first conductive layer disposed on the first insulating layer and comprising a touch electrode;
- a second insulating layer disposed on the first conductive layer and comprising a first opening;
- a second conductive layer disposed on the second insulating layer; and
- a third insulating layer disposed between the first insulating layer and the first conductive layer,
- wherein the first opening exposes at least a portion of the sensing line and at least a portion of the touch electrode,
- wherein a projection of the third insulating layer on the substrate is located within a projection of the second insulating layer on the substrate.

11. The electronic device as claimed in claim 10, wherein the metal layer further comprises a drain electrode, the second insulating layer further comprises a second opening, and the second opening exposes at least a portion of the drain electrode.

12. The electronic device as claimed in claim 11, wherein the second conductive layer further comprises a pixel electrode, and at least a portion of the pixel electrode covers the second opening and is electrically connected to the drain electrode.

* * * * *